United States Patent [19]
Sohn et al.

[11] Patent Number: 6,077,750
[45] Date of Patent: Jun. 20, 2000

[54] METHOD FOR FORMING EPITAXIAL CO SELF-ALIGN SILICIDE FOR SEMICONDUCTOR DEVICE

[75] Inventors: Dong Kyun Sohn, Daejeon; Jeong Soo Byun, Cheongju, both of Rep. of Korea

[73] Assignee: LG Semicon Co., Ltd., Chungcheongbuk-do, Rep. of Korea

[21] Appl. No.: 09/178,893

[22] Filed: Oct. 27, 1998

[51] Int. Cl.$^7$ ................................................. H01L 21/336
[52] U.S. Cl. ............................................ 438/303; 438/306
[58] Field of Search ................................ 257/321; 451/41; 438/301, 315, 193, 296, 486, 715, 303, 297, 306

[56] References Cited

U.S. PATENT DOCUMENTS

| | | | |
|---|---|---|---|
| 4,470,189 | 9/1984 | Roberts et al. | 29/571 |
| 4,617,724 | 10/1986 | Yokoyama et al. | 29/576 B |
| 4,683,554 | 7/1987 | Lockwood et al. | 365/185 |
| 4,713,358 | 12/1987 | Bulat et al. | 437/65 |
| 4,755,478 | 7/1988 | Abernathey et al. | 437/41 |
| 5,154,023 | 10/1992 | Sioshansi | 51/323 |
| 5,372,958 | 12/1994 | Miyasaka et al. | 437/40 |
| 5,419,805 | 5/1995 | Jolly | 156/643.1 |
| 5,427,971 | 6/1995 | Lee et al. | 437/44 |
| 5,728,619 | 3/1998 | Tsai et al. | 438/297 |
| 5,930,632 | 7/1999 | Gardner et al. | 438/287 |

OTHER PUBLICATIONS

Byun, J. et al., "Layer Reversal of Co/Zr Bilayer and Epitaxial Growth of $CoSi_2$ Layer on Si(001) Substrate", *J. Electrochem. Soc.*, vol. 142, No. 8, pp. 2805–2812, Aug. 1995.

Tung, R.T., "A Novel Technique for Ultrathin $CoSi_2$ Layers: Oxide Mediated Epitaxy", *Extended Abstracts of the 1996 International Conference on Solid States Devices and Materials*, pp. 133–135, 1996.

*Primary Examiner*—John F. Niebling
*Assistant Examiner*—Walter L. Lindsay, Jr.
*Attorney, Agent, or Firm*—Morgan, Lewis & Bockius LLP

[57] ABSTRACT

The present invention relates to forming epitaxial Co self-align silicide for a semiconductor device. An epitaxial Co self-align suicide layer for a semiconductor device is formed by forming a buffer layer on a silicon substrate, depositing cobalt thereon and applying an annealing process thereto to restrain silicon and cobalt from radically reacting on each other when applying the annealing process after depositing cobalt on the silicon substrate. The buffer layer is formed by performing a surface treatment using $CHF_3$ or $O_2$ onto the silicon substrate, applying an ion implantation using carbon, fluorine or oxygen to the silicon substrate, or exposing the silicon substrate to oxygen plasma. The present invention has an effect of forming shallow junction for a scaling down process to improve the integration of the semiconductor device.

18 Claims, 5 Drawing Sheets

METHOD FOR FORMING EPITAXIAL CO SELF-ALIGN SILICIDE FOR SEMICONDUCTOR DEVICE

BACKGROUND OF THE INVENTION

1. Field of the Invention

The present invention relates to a semiconductor device, and more particularly to a method for forming epitaxial Co self-align suicide for a semiconductor device suitable for high-integrated semiconductor devices.

2. Description of the Background Art

As semiconductor devices become miniaturized up to 0.18 to 0.13μ, plate resistance of a microgate is increased. In order to settle such a problem, Co-silicide will be widely applied to gates having size under 0.18μ, since it has low resistance in micropatterns compared to Ti-silicide which is currently used.

A conventional method for fabricating a semiconductor device using Co-silicide having low resistance will be described with reference to the accompanying drawings.

As shown in FIGS. 1A and 1B, a gate electrode 3 is formed on a silicon substrate 1 wherein an active domain 1a and an isolated domain 1b are defined, and an insulating film 4 is formed on the silicon substrate 1 including the gate electrode 3. The insulating film 4 is formed of a silicon oxide film by a chemical vapor deposition method (CVD). A reference numeral 2 is a field insulator film.

In FIG. 1C, an anisotropic etching process is applied to the insulating film 4 without a mask, for thereby forming a sidewall spacer 5 at each side of the gate electrode 3, and an impurity area 6 is formed by which an ion implantation is applied to an externally exposed part of the silicon substrate 1 by using the gate electrode 3 and the sidewall spacer 5 as a mask. When the silicon substrate 1 is p-type, an n-type impurity such as As, P is implanted into the impurity area 6, for thereby fabricating an NMOS transistor. Whereas, when the silicon substrate 1 is n-type, a PMOS transistor is fabricated by an ion implantion of a p-type impurity such as B, $BF_3$ into the area 6.

As shown in FIGS. 1D and 1E, a Co layer 7 is formed on the entire surface of the silicon substrate 1, including the gate electrode 3 and the sidewall spacer 5 by CVD, and a Co self-align silicide layer 8 is formed in the gate electrode 3 and the impurity area 6 by annealing the Co layer. Here, a part of the Co layer 7 which is formed on the sidewall spacer 5 is removed by a wet etching method.

However, the conventional method for forming the Co-silicide for the semiconductor device has several problems.

When applying the annealing process after depositing the Co layer, cobalt and silicon radically react on each other and thus silicon in the gate electrode and the impurity area is excessively consumed, and the Co-silicide layer is excessively formed. Accordingly, it is difficult to form a shallow junction required for scaling down the semiconductor device in order to increase the integration thereof.

In addition, there is a limit to decrease resistance due to limit of specific resistance of multi-crystalline Co-silicide, and since thickness of the Co-silicide layer is not uniform, the uniformity of contact resistance and plate resistance thereof may not be obtained.

To solve such problem, the silicon substrate is put in a wet chemical, for thereby having many porosities at a surface thereof, and then cobalt is deposited thereon and the annealing process is applied. Although epitaxial Co-silicide may be formed according to the above method, an uneven silicide layer is formed due to the composition of the chemical because the chemical applied to the substrate is a hot solution containing hydrogen peroxide.

SUMMARY OF THE INVENTION

Accordingly, the present invention is directed to obviate the problems due to limitations and disadvantages of the related art.

An object of the present invention is to provide epitaxial Co self-align silicide for a semiconductor device that has uniform thickness by forming a buffer layer on a gate electrode and an impurity area, for thereby restraining silicon and cobalt from radically reacting on each other when applying an annealing process after depositing cobalt on the gate electrode and the impurity area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for forming epitaxial Co self-align silicide for a semiconductor device includes; forming a gate electrode on a silicon substrate; forming an insulating sidewall spacer at each side of the gate electrode; forming an impurity area in a part of the silicon substrate which is adjacent to the gate electrode and the sidewall spacer; forming a buffer layer in the gate electrode and the impurity area; and depositing cobalt on the buffer layer and applying an annealing process thereto.

The buffer layer may be formed by the following methods.

First, a surface treatment using $CHF_3$ and $O_2$ is applied onto the gate electrode and the impurity area.

Second, an ion implantation using carbon, fluorine or oxygen is applied to the gate electrode and the impurity area.

Lastly, the gate electrode and the impurity area are exposed to oxygen plasma.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1A:
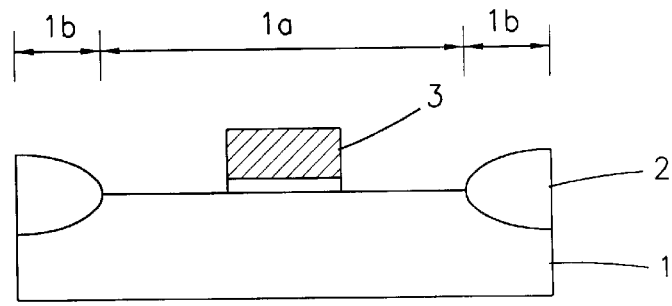
FIGS. 1A through 1E are vertical cross-sectional views illustrating a method for forming a Co self-align silicide layer for a conventional semiconductor device.
Figure 1B:
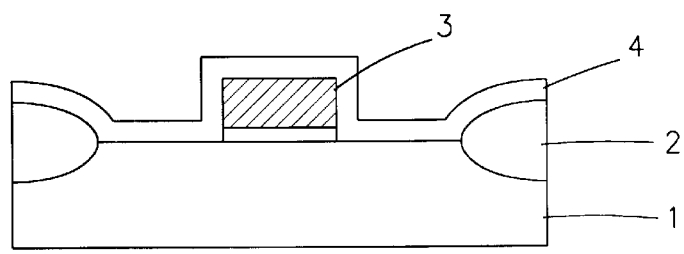
Figure 1C:
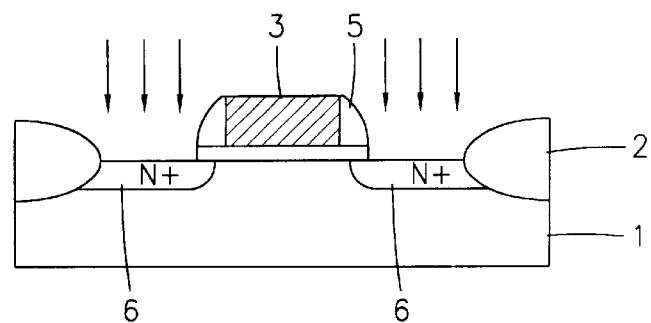
Figure 1D:
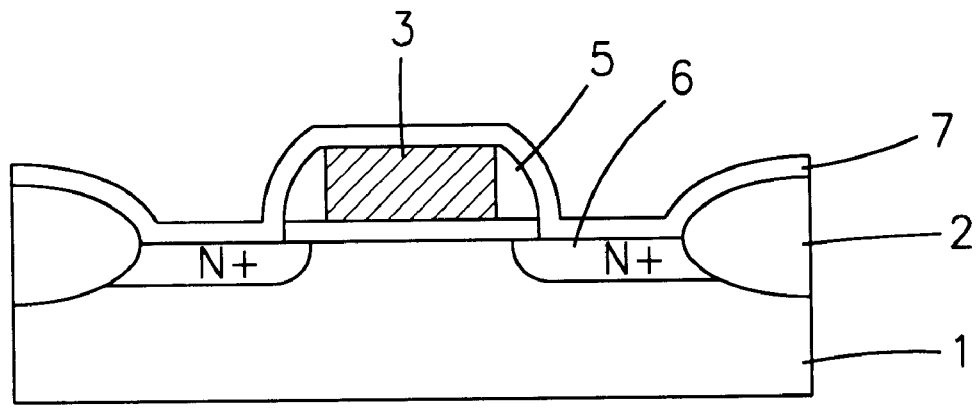
Figure 1E:
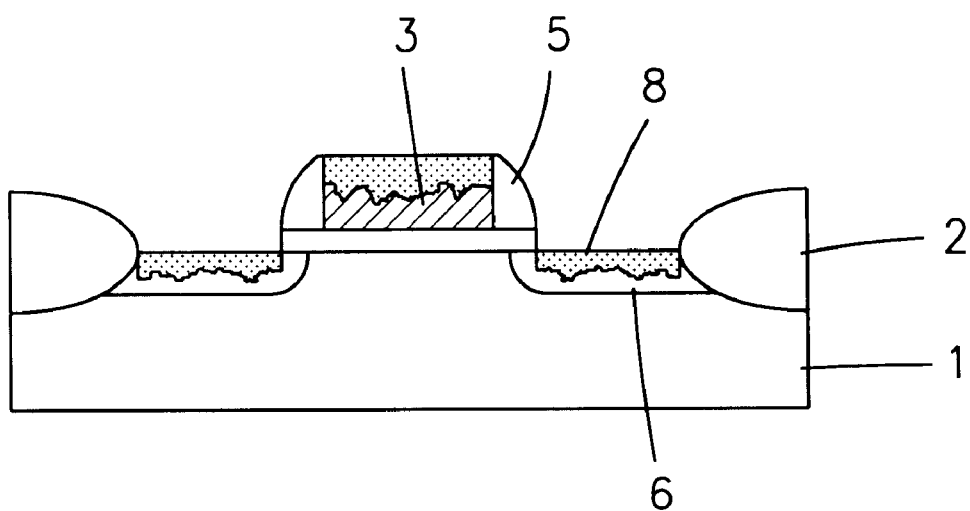
Figure 2A:
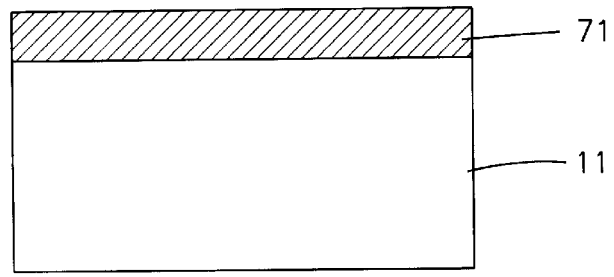
FIGS. 2A through 2C are vertical cross-sectional views illustrating a method for forming a Co self-align silicide layer for a semiconductor device according to a first embodiment of the present invention.
Figure 2B:
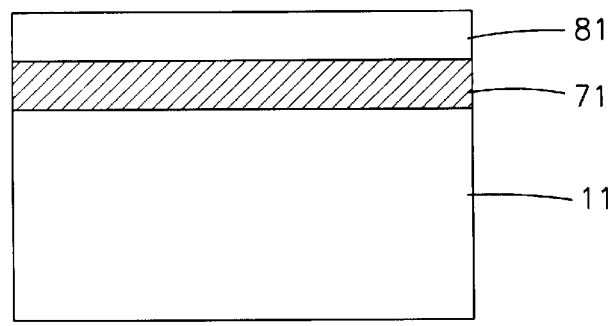
Figure 2C:
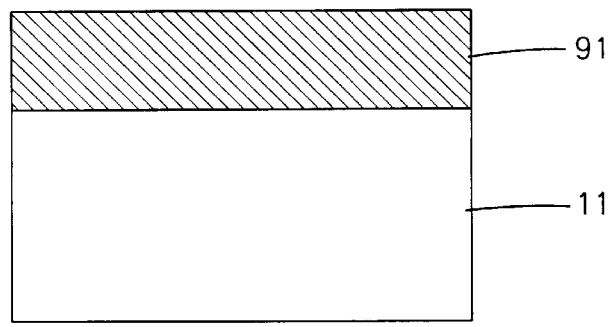

FIGS. 2A through 2C illustrate a method for forming Co self-align silicide for a semiconductor device according to a first embodiment of the present invention.

In FIG. 2A, a buffer layer 71 can be formed by various methods.

First, a surface treatment using $CHF_3$ and $O_2$ is applied onto a surface of a silicon substrate 11, for thereby forming the buffer layer 71. Here, the buffer layer 71 is formed of SiCx, SiFx or SiOx.

Second, carbon, fluorine or oxygen is implanted into the silicon substrate 11, for thereby forming the buffer layer 71, which is formed of SiCx or SiFx.

Third, the buffer layer 71 of SiOx is formed by exposing the upper surface of the silicon substrate 11 to oxygen plasma. Here, x of SiCx is less than 1 (x<1), x of SiFx is less than 0.5 (x<0.5) and x of SiOx is less than 2 (x<2).

Since such methods easily control a value of x, the method according to the present invention may have the buffer layer in excellent condition.

As shown in FIGS. 2B and 2C, a Co layer 81 is formed on the buffer layer 71 and an annealing process is applied thereto, for thus an epitaxial Co self-align silicide layer 91 is uniformly formed. Here, the buffer layer 71 restrains Co and Si from radically reacting on each other during the annealing process.

Now, a method for forming a Co self-align suicide layer for a semiconductor device according to a second embodiment of the present invention will be described referring to FIGS. 3A through 3F.

Figure 3A:
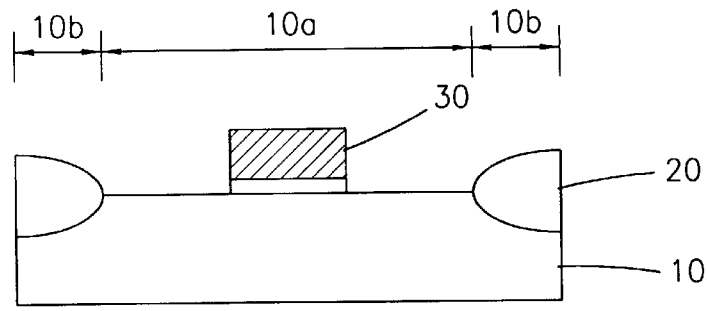
FIGS. 3A through 3F are vertical cross-sectional views illustrating a method for forming a Co self-align silicide layer for a semiconductor device according to a second embodiment of the present invention.
Figure 3B:
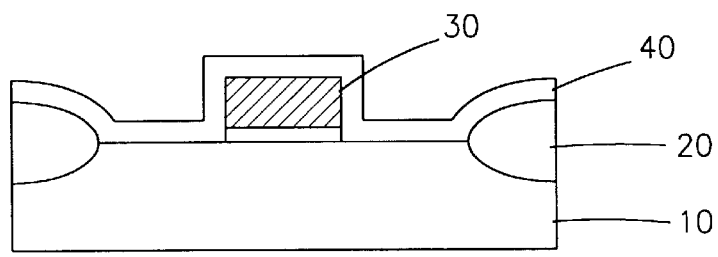

As shown in FIGS. 3A and 3B, a gate electrode 30 is formed on a silicon substrate 10 wherein an active domain 10a and an isolated domain 10b are defined, and an insulating film 40 is formed on the silicon substrate 10 including the gate electrode 30. The insulating film 40 is formed of a silicon oxide film, a silicon nitride film or a composition thereof by CVD. A reference numeral 20 is a field insulator film.

Figure 3C:
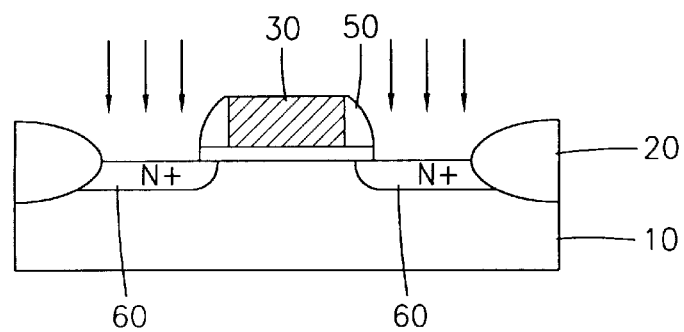

In FIG. 3C, an anisotropic etching process is applied to the insulating film 40 without a mask, for thereby forming a sidewall spacer 50 at each side of the gate electrode 30, and an impurity area 60 is formed by which the ion implantation is applied to an externally exposed part of the silicon substrate 10 by using the gate electrode 30 and the sidewall spacer 50 as the mask. When the silicon substrate 10 is p-type, an n-type impurity such as As, P is implanted into the impurity area 60, for thereby fabricating an NMOS transistor. Whereas, when the silicon substrate 10 is n-type, a PMOS transistor is fabricated by the ion implantion of a p-type impurity such as B, $BF_3$ into the area 60.

Figure 3D:
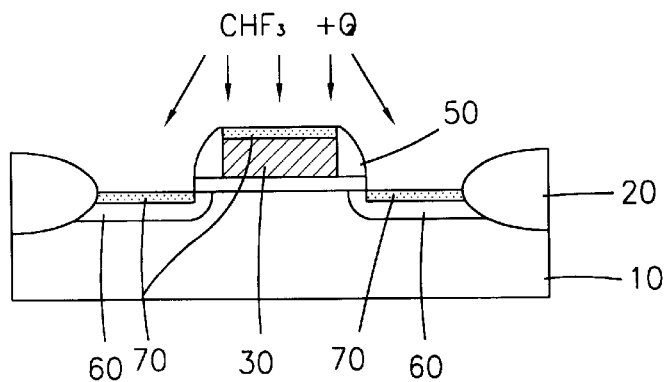

As shown in FIG. 3D, a buffer layer 70 is formed on the gate electrode 30 and the impurity area 60. Since the method for forming the buffer layer 70 is same as the method for forming the buffer layer 71 according to the first embodiment of the present invention, the description thereof will be omitted.

Figure 3E:
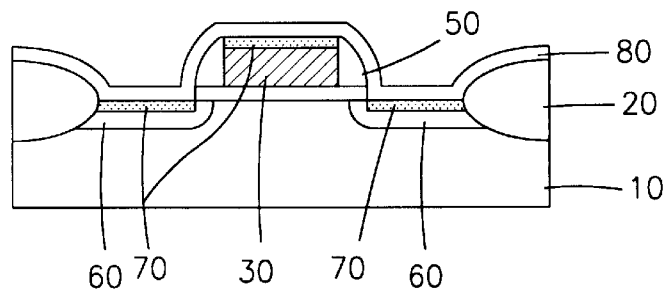
Figure 3F:
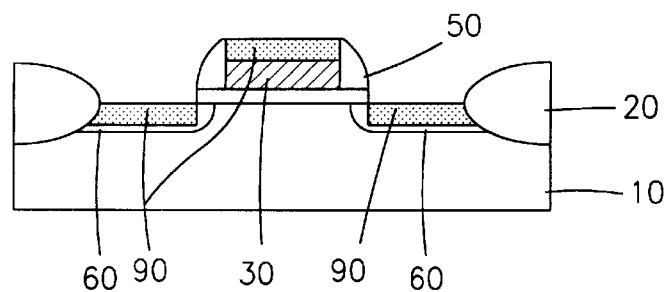

As shown in FIGS. 3E and 3F, a Co layer 80 is formed on an entire surface of the silicon substrate 10 including the buffer layer 70 by CVD and the annealing process is applied thereto, for thereby forming an epitaxial Co self-align silicide layer 90 in the gate electrode 30 and the impurity area 60. Here, the buffer layer 70 serves as a diffusion barrier which retrains silicon in the gate electrode 30 and the impurity area 60 from radically reacting on cobalt in the Co layer 80. The part of the Co layer 80 formed on the sidewall spacer is removed by the wet etching method.

As described above, the epitaxial Co self-align silicide layer of the present invention may have a uniform thickness by forming the buffer layer on the gate electrode and the impurity area, before depositing cobalt thereon, to restrain silicon and cobalt from radically reacting on each other during the annealing process.

In addition, the method of the invention has an effect of forming shallow junction for a scaling down process to improve the integration of the semiconductor device.

It will be apparent to those skilled in the art that various modifications and variations can be made in the method for forming the epitaxial Co self-aligned silicide layer for the semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming epitaxial Co self-align silicide for a semiconductor device, comprising:

forming a buffer layer on a silicon substrate by applying a surface treatment using $CHF_3$ and $O_2$ to the silicon substrate; and forming a Co layer on the buffer layer and applying an annealing process thereto.

2. The method according to claim 1, wherein the buffer layer is either an SiCx layer, an SiFx layer or an SiOx layer.

3. The method according to claim 2, wherein x of the SiCx layer is less than 1 (x<1).

4. The method according to claim 2, wherein x of the SiFx layer is less than 0.5 (x<0.5).

5. The method according to claim 2, wherein x of the SiOx layer is less than 2 (x<2).

6. A method for forming epitaxial Co self-align silicide for a semiconductor device, comprising:

forming a buffer layer on a silicon substrate by implanting carbon and fluorine onto the silicon substrate; and forming a Co layer on the buffer layer and applying an annealing process thereto.

7. The method according to claim 6, wherein the buffer layer is either an SiCx layer or an SiFx layer.

8. The method according to claim 7, wherein x of the SiCx layer is less than 1 (x<1).

9. The method according to claim 7, wherein x of the SiFx layer is less than 0.5 (x<0.5).

10. A method for forming epitaxial Co self-align silicide for a semiconductor device, comprising:

forming a buffer layer on a silicon substrate by exposing the silicon substrate to oxygen plasma; and forming a Co layer on the buffer layer and applying an annealing process thereto.

11. The method according to claim 10, wherein the buffer layer is an SiOx layer.

12. The method according to claim 11, wherein x of the SiOx layer is less than 2 (x<2).

13. A method for forming epitaxial Co self-align silicide for a semiconductor device, comprising:

forming a gate electrode on a silicon substrate;

forming an insulating sidewall spacer at each side of the gate electrode;

forming an impurity area in a part of the silicon substrate which is adjacent to the gate electrode and the sidewall spacer;

forming a buffer layer in the gate electrode and the impurity area;

forming a cobalt layer on the buffer layer and applying an annealing process thereto; and wherein the buffer layer is formed by applying a surface treatment using $CHF_3$ and $O_2$ onto the gate electrode and the impurity area.

14. A method for forming epitaxial Co self-align silicide for a semiconductor device, comprising:

forming a gate electrode on a silicon substrate; forming an insulating sidewall spacer at each side of the gate electrode;

forming an impurity area in a part of the silicon substrate which is adjacent to the gate electrode and the sidewall spacer;

forming a buffer layer in the gate electrode and the impurity area;

forming a cobalt layer on the buffer layer and applying an annealing process thereto; and wherein the buffer layer is formed by applying an ion implantation using carbon and fluorine to the gate electrode and the impurity area.

15. A method for forming epitaxial Co self-align silicide for a semiconductor device, comprising:

forming a gate electrode on a silicon substrate;

forming an insulating sidewall spacer at each side of the gate electrode;

forming an impurity area in a part of the silicon substrate which is adjacent to the gate electrode and the sidewall spacer;

forming a buffer layer in the gate electrode and the impurity area;

forming a cobalt layer on the buffer layer and applying an annealing process thereto; and wherein the buffer layer is formed by exposing the gate electrode and the impurity area to oxygen plasma.

16. A method for forming epitaxial Co self-align silicide for a semiconductor device, comprising:

forming a gate electrode on a silicon substrate;

forming an insulating sidewall spacer at each side of the gate electrode;

forming an impurity area in a part of the silicon substrate which is adjacent to the gate electrode and the sidewall spacer;

forming a buffer layer in the gate electrode and the impurity area;

forming a cobalt layer on the buffer layer and applying an annealing process thereto; and wherein the buffer layer comprises either an $SiC_x$ layer, or an $SiF_x$ layer.

17. The method according to claim 16, wherein x of the $SiC_x$ layer is less than 1 ($x<1$).

18. The method according to claim 16, wherein x of the $SiF_x$ layer is less than 0.5 ($x<0.5$).

* * * * *